United States Patent [19]

Hayes et al.

[11] Patent Number: 5,142,725
[45] Date of Patent: Sep. 1, 1992

[54] CARROUSEL PLATE WASHOUT UNIT

[76] Inventors: Timothy B. Hayes, 68 W. Raleigh, Mansfield, Ohio 44907; Orville L. Hayes, Jr., 615 Orchard Dr., Mansfield, Ohio 44904

[21] Appl. No.: 506,686

[22] Filed: Apr. 9, 1990

[51] Int. Cl.$^5$ ............................. A46B 13/04
[52] U.S. Cl. .............................. 15/77; 15/88; 15/88.4; 354/317
[58] Field of Search ............ 15/56, 71, 72, 75, 76, 15/77, 88, 88.4, 101, 102; 354/317

[56] References Cited

U.S. PATENT DOCUMENTS

| | | | |
|---|---|---|---|
| 2,024,812 | 12/1935 | Bachelis | 15/75 |
| 2,955,304 | 10/1960 | Noe | 15/75 |
| 3,195,158 | 7/1965 | Scholtus | 15/56 |
| 3,286,291 | 11/1966 | Linne | 15/76 |
| 3,838,473 | 10/1974 | Remih | 15/76 |
| 3,922,890 | 12/1975 | Shibata | 15/76 |
| 4,201,015 | 5/1980 | Reim | 15/77 |
| 4,428,659 | 1/1984 | Howard | 15/77 |
| 4,554,696 | 11/1985 | Nye, Jr. | 15/21 D |
| 4,740,075 | 4/1988 | Schoernig | 15/77 |

*Primary Examiner*—Edward L. Roberts
*Attorney, Agent, or Firm*—Jerry Semer

[57] ABSTRACT

This invention is an apparatus and method of removing the unhardened portion of a coating. More specifically, the preferred embodiment is an apparatus that removes the unhardened portion of photopolymer plate after it has been exposed. The apparatus is made of basically four parts, a tank that contains the solvent and cylinder within the tank where the plate to be washed is placed along the inside wall, a carrousel which is made up of cylindrical brushes and flotation chamber, and a motor to drive the carrousel in a rotary fashion. The plate to be washed is placed on the inside wall of the cylinder. The brushes of the carrousel hold the place in place against the wall and when the motor is turned on, these brushes are driven against the plate by centrifugal force and brush off the unhardened portion of the plate.

15 Claims, 5 Drawing Sheets

CARROUSEL PLATE WASHOUT UNIT

FIELD OF THE INVENTION

This invention relates generally to an apparatus and method for removing the unhardened portion of a coating.

BACKGROUND OF THE INVENTION

The present invention is an improvement on apparatuses and methods for removing the unhardened portion of a coating. This invention, in its preferred embodiment, is used to clean photopolymer printing plates. However, it would be clear to anyone skilled in the art from the discussion of the invention in the context of a photopolymer printing plate that it will have wide utility in a broad range of applications when portions of coatings are removed from a substrate.

Modern printing now commonly utilizes printing plates having photographically produced relief images. These photoplates are usually made of a laminated structure. This structure usually consists of a thin coating of a photosensitive composition bonded to a metal or plastic substrate. The desired image is usually obtained by placing the plate in a vacuum frame with the negative firmly affixed against the plate. The plate is then exposed to electromagnetic radiation, usually ultraviolet light. This exposure causes certain areas of the photosensitive composition to harden while others remain soft when exposed to the proper solvents. The plate is then scrubbed to remove the unhardened photosensitive composition, thereby producing the desired relief image.

This invention is an improvement on the present methods and apparatuses used to scrub the plate to remove the unhardened photosensitive composition. The machines which are presently used to perform the washout step, use large brushes or multiples of smaller flat brushes. These brushes are usually driven in an orbital or oscillating horizontal manner which simulates hand or manual scrubbing. Because of the complicated orbital and oscillating manner these brushes move, these machines are very large and very expensive. In fact, due to the size and cost of these machines, many plates are still washed by hand. Hand washing is, however, very difficult and time consuming and cannot be done uniformly or efficiently.

Thus, the object of this invention is to produce a machine that washes the plates uniformly and efficiently as well as being inexpensive and compact. The main feature of the invention to achieve this objective is to place the plates on the walls of a cylindrical tank filled with solvent. A carrousel with cylindrical brush is placed in the tank. An electric motor drives the carrousel and causes the brushes to rub against the plates. The advantages of my invention over the previous art is that it is compact and less expensive to make and use. Most of the machines designed to wash out plates of 25 inches × 18 inches in the previous art weight between 400 lbs. and 2000 lbs. and take up between 9 and 30 square feet of floor space; whereas my invention to wash out the same size plate weighs 45 pounds and takes up approximately one square foot of floor space.

BRIEF DESCRIPTION OF THE DRAWINGS

The drawings illustrate one embodiment of the invention.

REFERENCE NUMERALS IN DRAWINGS

Figure 1:
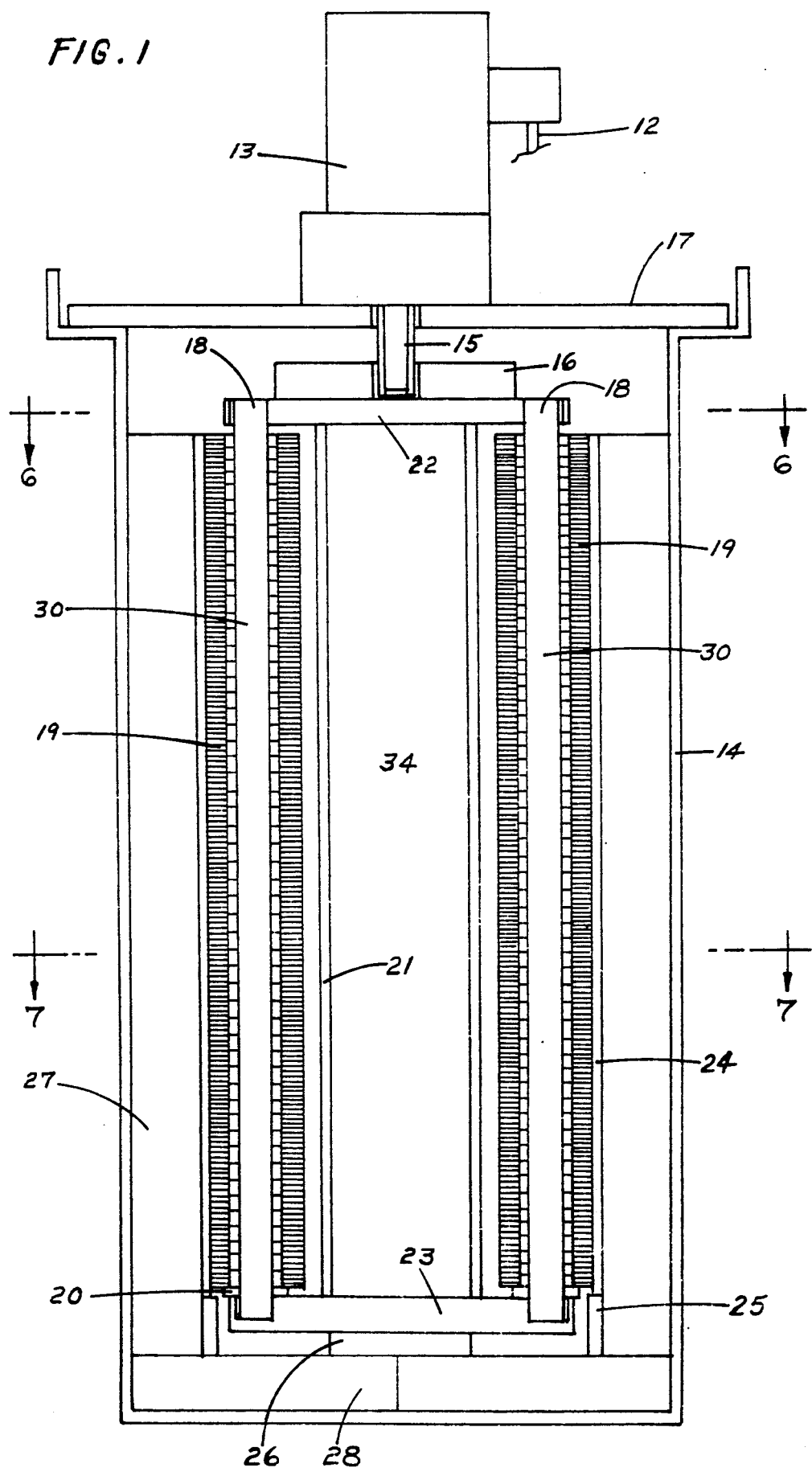
FIG. 1 is a cross section view of the invention.

10 motor
14 tank
15 shaft
16 drive plate
17 motor mounting plate
18 brush shaft
19 brush bristles
20 washers
21 center tube
22 upper carrousel end plate
23 lower carrousel end plate
24 cylinder
25 lower plate locaters
26 lower locating plate
27 side ribs
28 lower support ribs
30 cylindrical brushes
32 carrousel
34 flotation chamber

SUMMARY OF THE INVENTION

This invention is an apparatus and methods of removing the unhardened portion of a coating. More specifically, the preferred embodiment is an apparatus that removes the unhardened portion of photopolymer plate after it has been exposed. The apparatus is made of basically four parts: a tank (14) that contains the solvent, a cylinder (24) within the tank where the plate to be washed is placed along the inside wall, a carrousel (32) which is made up of cylindrical brushes (30) and flotation chamber (34), and a motor (10) to drive the carrousel (32) in a rotary fashion. The plate to be washed is placed on the inside wall of the cylinder (24). The brushes (30) of the carrousel (32) hold the plate in place against the wall and when the motor (10) is turned on, these brushes (30) are driven against the plate by centrifugal force and brush off the unhardened portion of the plate.

DESCRIPTION OF THE PREFERRED EMBODIMENT

Reference is now made to the figures which illustrate one embodiment of this application. As I already pointed out in the background of the invention, the preferred embodiment is used to clean a photopolymer printing plate. However, it would be clear for anyone skilled in the art from this discussion of the invention, that it will have wide utility in a broad range of applications when portions of coatings are removed from a substrate. In its simplest form, the invention comprises a cylindrical tank which can be filled with solvent and the plates to be washed out are attached or placed against the inside wall of this tank, a carrousel (32) with cylindrical brushes (30) which is designed such that the cylindrical brushes (30) will brush the plates when the carrousel (32) is driven by a motor (10).

In the preferred embodiment the cylindrical tank is two elements. A tank (14) that holds the solvent and the cylinder (24) on which the plates are attached or placed against. In the preferred embodiment the tank (14) is made of polyethylene. However, the tank (14) can be made of any material that holds solvent. The preferred embodiment was designed to wash out a plate twenty-five inches by eighteen inches (25"×18"). For this the tank (14) dimensions were twelve inches by twelve inches by twenty-four inches high (12"×12"×24"). This tank (14) in the preferred embodiment is square; however, it can take any shape.

Figure 7:
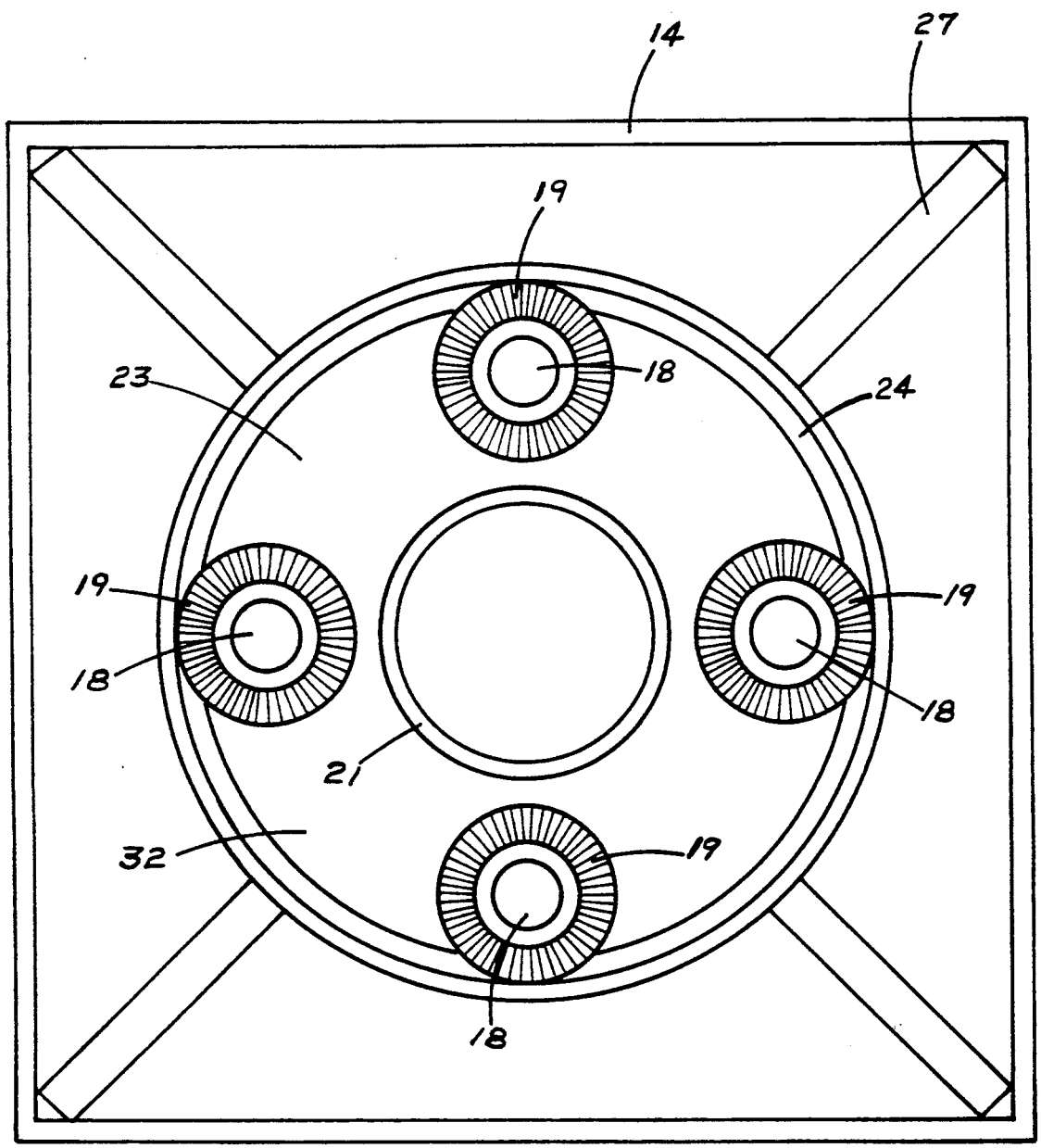
FIG. 7 is the top view of the invention.

A stationary cylinder (24) is placed into the tank. For plates twenty-five inches (25") long and eighteen inches (18") high, this cylinder (24) can be with an inside diameter of 8.25 inches and a height of 18.5. In the preferred embodiment this cylinder (24) is made out of PVC plastic; however, it can be made out of any material which is not deteriorated by the solvent. The cylinder (24) is held in its proper position by ribs (27). The ribs (27) in the preferred embodiment are made out of PVC plastic; however, they can be made out of any material that is not deteriorated by the solvent. In the preferred embodiment, these ribs (27) are attached to the sides of the cylinder (24) shown in FIG. 4. When the cylinder (24) is placed into the tank (14) the ribs (27) fix into the corners of the tank (14) as shown in FIG. 7 and hold the cylinder (24) in place. These ribs (27) perform three important functions. First, the ribs (27) locate and center the cylinder (24) in the tank (14). Second, the ribs (27) keep the cylinder (24) from rotating inside the tank (14) due to the friction caused by the cylindrical brushes (30) on the carrousel (32) rubbing the plates and cylinder (24) when the carrousel (32) is rotated. Lastly, the ribs (27) stop the cyclonic swirling of the solvent as it is expelled from the inner surface of the cylinder (24). This prevents undue foaming. It also causes the swirling of the solvent to suddenly slow down which allows the washed out polymer particles suspended in the solvent to settle out, leaving clean solvent to be drawn back into the spinning carrousel. This slowing down is enhanced in the preferred embodiment because the outer area between the innerwall of the tank and the outer wall of the cylinder contains over seventy-five percent of the solvent. A filter system could be added to this invention to filter out the suspended polymer particles; however, by using the ribs (27) to slow down the swirling and having a large reservoir of solvent on the outside of the cylinder, a filtering system would not be necessary in most cases.

The carrousel (32) is placed inside the cylinder (24). The carrousel (32) in the preferred embodiment consists of four parts, 1. cylindrical brushes (30) with brush bristles (19) on shafts (18), 2. center tube (21), 3. upper carrousel end plate (22), and 4. lower carrousel end plate (23). In the preferred embodiment the cylindrical brushes (30) are made of close wound 0.003 inch diameter nylon bristles (19) which are designed to fit snuggly on ¾ inch brush shaft (18). The cylindrical brush (30) is 2.125 inches in diameter. In the preferred embodiment which is designed to wash out 18 inch by 25 inch plates, the cylindrical brushed (30) are 18.5 inches long. In the preferred embodiment, the shafts (18) are nylon and ¾ inch in diameter and extend beyond the end of the cylindrical brushes (30). The shaft (18) is made out of nylon, is corrosion resistant to the solvent and has a low coefficient of friction and is light weight. The brush bristles (19) are also made out of nylon due to their resistance to corrosion from the solvent.

The center tube (21) of the carrousel is a hollow tube permanently attached to the upper and lower carrousel and plates (22 and 23). In the preferred embodiment this center tube (21) is made out of PVC plastic with an outside diameter of 3½ inches and an inner diameter of 3 inches. The center tube (21) is glued to the upper and lower carrousel end plates (22 and 23) to form a rigid air tight center tube which serves as a flotation chamber (34) to offset part of the downward force exerted by the weight of the carrousel assembly.

Figure 6:
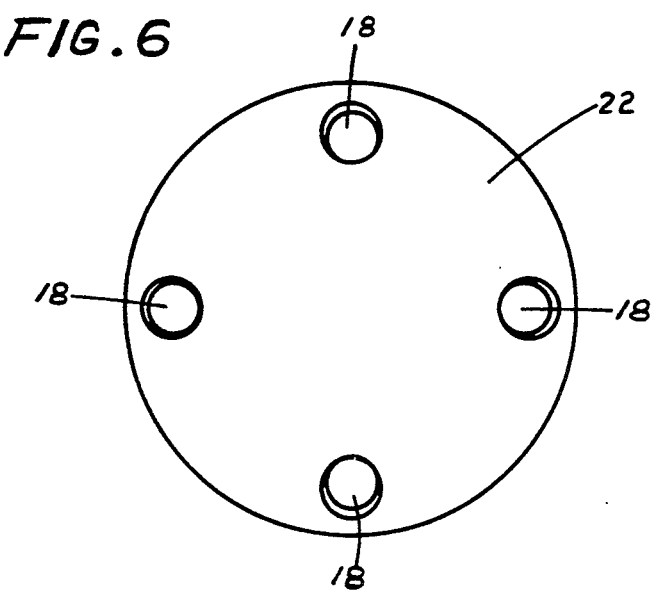
FIG. 6 is the top view of the upper end plate.

The upper carrousel and plate (22) has equally spaced holes for the location of the upper brush shaft ends as shown in FIG. 6. In the preferred embodiment, all holes are 0.06 inches bigger in diameter than the shaft (18) being supported. When the carrousel (32) is placed inside the cylinder (24), the holes for the cylindrical brush shafts (18) are diametrically located to cause all brushes to contact the inner wall of the cylinder (24). Before the carrousel (32) is rotated, all the clearance in the holes is located towards the outside as shown in FIG. 6. When the carrousel (32) is rotated a centrifugal force acts on each brush (32) forcing it to move out radially and exert the force on the inner wall of the cylinder (24) where the plate is attached. When a plate is placed inside the stationary cylinder (24) and the carrousel (32) is rotated, the cylindrical brushes (30) are forced against the plate and the friction causes the cylindrical brushes (30) to rotate. The rotary action also moves the solvent across the plates surface at a high rate of speed which facilitates in the removal of the unhardened portion of the coating.

The lower carrousel end plate (23) is essentially designed exactly as the upper carrousel end plate (22) except the holes do not go all the way through the plate. The lower end plate (22) has the same size holes, and the holes in the same position on the plate as the upper end plate (22). The lower end plate is glued to the center tube (21) to form an air-tight seal. see FIG. 1. The shafts (18) of the cylindrical brushes (30) fit within the holes on the lower and upper end plates (22 and 23). Washers (20) are used to hold the bristles (19) of the brushes off the lower end plate (23) as shown in FIG. 1. Clearance is allowed between the top of the brush bristles (19) of the cylindrical brushes (30) and the upper carrousel end plate (22) so that the brush assembly can be easily removed by lifting up and pulling out.

Figure 4:
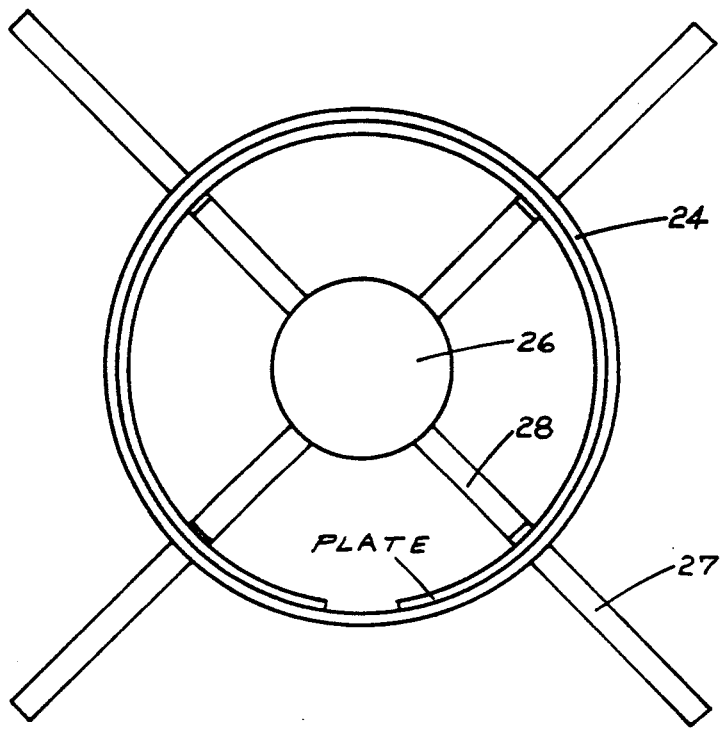
FIG. 4 is the top view of the invention with the carrousel.
Figure 5:
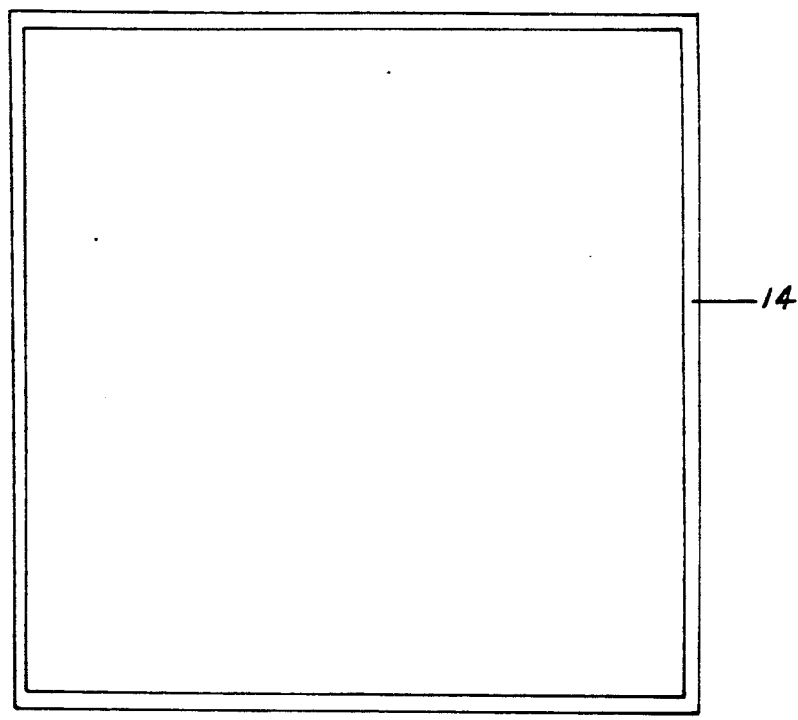
FIG. 5 is the top view of the tank.

To hold the cylinder (24) off the bottom of the tank (14), lower support ribs (28) are placed in the bottom of the tank (14). These lower support ribs (28) are made out of plastic in the preferred embodiment and are permanently cemented to the bottoms of the side ribs (27) and to each other where they meet at the center as shown in FIG. 4. The function of these ribs is to locate the cylinder (24) and to hold the carrousel (32) off the bottom of the tank and allow room for the polymer particles brushed from the plates which settled to accumulate.

Cemented to the lower support ribs (28) is the lower locating plate (26). The lower locating plate (26) is placed equidistant from all sides of the cylinder (24) as shown in FIG. 4. The plate is made out of PVC plastic in the preferred embodiment due to the low coefficient of friction. This lower locating plate (26) provides support and locates the carrousel (32) vertically inside the cylinder. This lower locating plate (26) is submerged in and lubricated by the solvent in the tank.

The lower plate locaters (25) are cemented to the side ribs (27) and the lower support ribs (28) as shown in FIG. 1. These ribs are designed to prevent large plates from being inserted too far down in the cylinder (24).

The last main part of this invention is the motor (10) to drive the carrousel (32). The carrousel (32) can be driven by any type of motor that produces rotary motion or even by hand with a crank or gear system. In the preferred embodiment this is done by an electric motor (10) which runs at 124 R.P.M. The electric motor (10) is attached to the motor mounting plate (17). In the preferred embodiment this plate (17) is made out of plastic and sits on a ridge at the top of the tank (14). The plate (17) is square to prevent rotation due to the torque of the motor. There should be a little clearance between the outer edge of the plate (17) and the tank to allow the motor drive to move radially to automatically adjust to the self-centering of the carrousel (32). The motor mounting plate (17) is held in place by the weight of the motor (10).

The electric motor (10) is attached to the carrousel (32) by a shaft (15) and a drive plate (16). In the preferred embodiment the shaft (15) is square and the drive plate (16) has a square hole to accept the shaft (15). The drive plate (16) is attached to the carrousel (32) by screws and is made of plastic.

Figure 2:
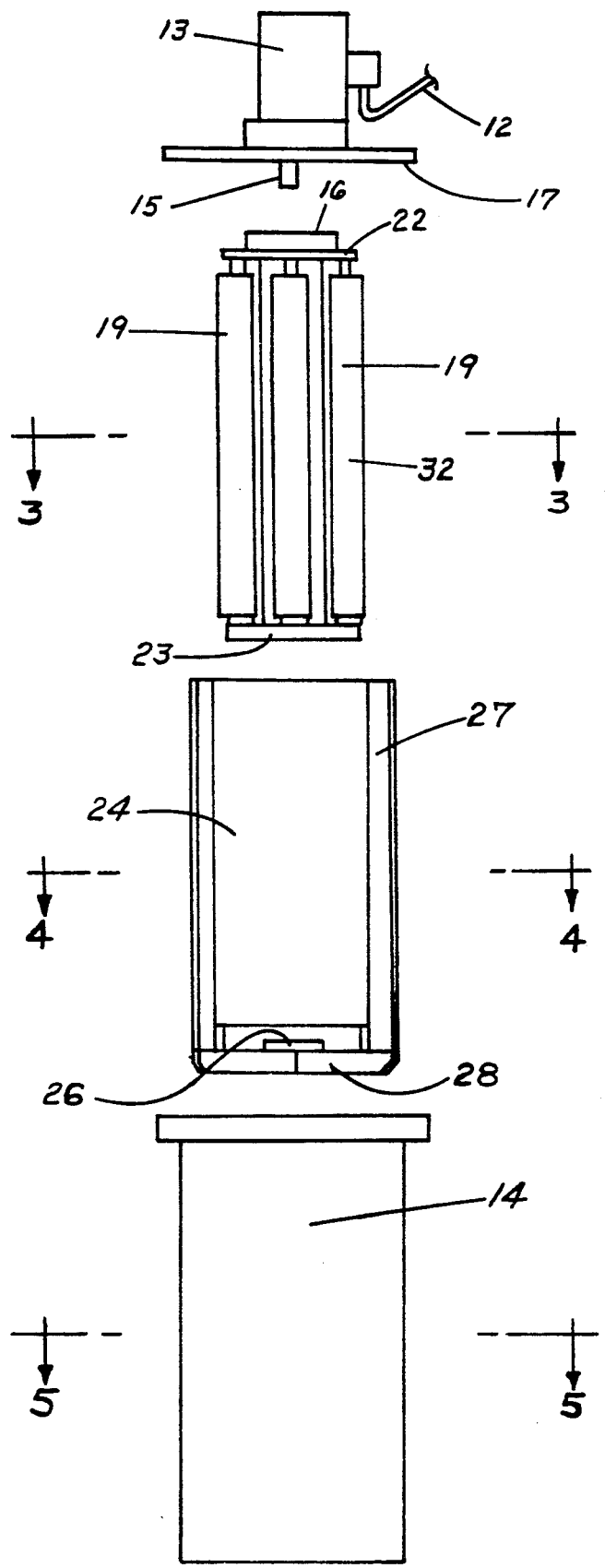
FIG. 2 is the sideview of the four main elements of the inventions and shows how the invention can be taken apart.
Figure 3:
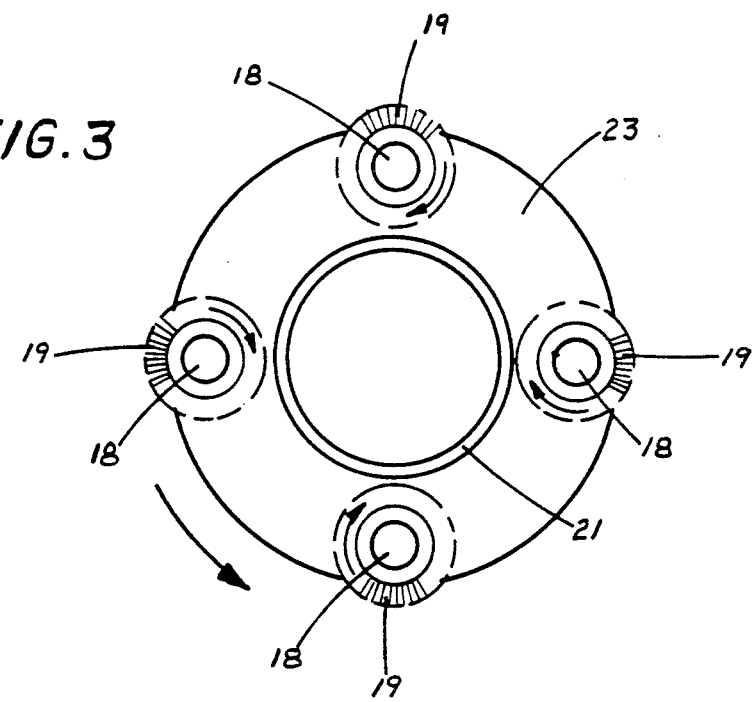
FIG. 3 is the top view of the carrousel.

FIG. 2 shows how the invention can be disassembled without tools for cleaning.

The basic operation of the preferred embodiment is to fill the tank (14) with solvent. The motor (10) and motor mounting plate (17) is lifted off and the photopolymer plate is put down into the cylinder (24) with the photopolymer side of the plate against the brushes (30). The motor (10) and the motor mounting plate (17) is placed back on the tank (14). The electric motor (10) is activated for approximately five minutes depending on the plate manufacturer's specifications. The motor (10) and motor mounting plate (17) is again lifted off and the clean plate is removed and examined.

Many changes and modifications in the above described embodiment of the invention can, of course, be carried out without departing from the scope thereof. Accordingly, that scope is intended to be limited only by the scope of the appending claims.

What is claimed is as follows:

1. An apparatus for removing a portion of a coating comprising:
   a. a tank which can be filled with an solvent; and,
   b. a means inside the tank for supporting a flexible plate in a substantially cylindrical configuration; and,
   c. a means inside said tank for mounting a brush means;
   d. a means for brushing mounted on said mounting means such that the brush means is inside the cylindrical configuration defined by a plate when said plate is mounted on said support means;
   e. a means for rotating the mounting means such that the brush means brushes coating from a plate mounted on said support means.

2. An apparatus as in claim 1 wherein the means for rotating is a motor connected to said mounting means.

3. An apparatus as in claim 2 wherein the motor is an electric motor and attaches to the mounting means by a shaft.

4. An apparatus as in claim 1 wherein:
   a. the mounting means comprises:
      (1) a central tube with an upper and lower end; and,
      (2) an upper end plate attached to the upper end of the central tube with a plurality of openings near its outer edge; and,
      (3) a lower end plate attached to the lower end of the central tube with a plurality of openings near its outer edge; and,
   b. the means for brushing comprising:
      (1) a plurality of brushes each of which are on shafts and said shafts of the brushes are placed in corresponding opening in the upper and lower end plates such that the brushes are mounted about the central tube on substantially a parallel axis.

5. An apparatus as in claim 4 wherein the means for supporting a flexible plate is a cylinder with an inside wall against which the flexible plate is supported.

6. An apparatus as in claim 5 wherein:
   the upper and lower end plates have openings of a larger diameter then the shaft creating clearance in the openings when the shafts are placed within; and,
   the brushes are adapted to make contact with inside wall of the cylinder causing the clearance in the openings to be located towards the outside; and,
   when the mounting means is rotated, the brushes are forced outward due to the centrifugal force and are driven against the inside wall of the cylinder.

7. An apparatus as in claim 6 wherein the upper and lower end plates are attached to the central tube with an air tight seal to form a flotation chamber such that the flotation chamber's buoyancy offset part of the weight of the mounting means and brush means.

8. An apparatus as in claim 1 wherein the means for supporting a flexible plate is a cylinder with an inside wall against which the flexible plate is supported.

9. An apparatus as in claim 8 further comprising:
   a. a solvent which is placed in the tank and swirls when the mounting means is rotated; and
   b. a means for slowing the swirling of the solvent.

10. An apparatus as in claim 9 wherein the means for slowing comprises one or more rectangular ribs attached to the cylinder.

11. An apparatus as in claim 10 wherein the rectangular ribs holds the cylinder in place in the tank by making contact with the tank.

12. An apparatus as in claim 9 further comprising a means for creating an area for the portion of the coating removed by the action of the brushes to accumulate.

13. An apparatus as in claim 12 wherein:
   a. the means for creating an area comprising:
      1. lower support ribs which are attached to the bottom of the cylinder and holds the cylinder in place in the tank; and,
      2. a lower plate locator which is attached to the lower support ribs and the rectangular ribs which provide a seat for said lower plate locator.

14. An apparatus as in claim 13 further comprises a means for locating the mounting mean vertical inside the cylinder.

15. An apparatus as in claim 14 wherein the means for locating is a lower locating plate which is attached to the lower support ribs and is equidistance from all sides of the cylinder and fit against the lower end plate.

* * * * *